United States Patent [19]
Akhavain et al.

[11] Patent Number: 5,341,564
[45] Date of Patent: Aug. 30, 1994

[54] METHOD OF FABRICATING INTEGRATED CIRCUIT MODULE

[75] Inventors: Mohammad Akhavain, San Diego; Ken W. Economy, Escondido, both of Calif.

[73] Assignee: Unisys Corporation, Blue Bell, Pa.

[21] Appl. No.: 60,689

[22] Filed: May 10, 1993

Related U.S. Application Data

[63] Continuation of Ser. No. 856,592, Mar. 24, 1992, abandoned.

[51] Int. Cl.⁵ .............................................. H05K 3/30
[52] U.S. Cl. .................................. 29/832; 29/840; 174/52.2; 437/183
[58] Field of Search ................... 29/827, 832, 840; 437/183; 174/52.2, 52.4

[56] References Cited

U.S. PATENT DOCUMENTS

| | | | |
|---|---|---|---|
| 3,214,827 | 11/1965 | Phohofsky | 361/409 |
| 3,379,937 | 4/1968 | Shepherd | 361/400 |
| 3,380,155 | 4/1968 | Burks | 437/183 |
| 4,545,610 | 10/1985 | Lakritz et al. | 437/183 X |
| 4,565,314 | 1/1986 | Scholz | 228/180.2 |
| 4,818,728 | 4/1989 | Rai et al. | 357/80 |
| 4,836,435 | 6/1989 | Napp et al. | 228/180.2 |
| 4,998,665 | 3/1991 | Hayashi | 228/180.1 |
| 5,006,920 | 4/1991 | Schafer et al. | 357/80 |
| 5,007,163 | 4/1991 | Pope et al. | 228/180.2 |
| 5,075,965 | 12/1991 | Carey et al. | 228/180.2 |
| 5,214,308 | 5/1993 | Nishiguchi et al. | 437/183 X |
| 5,250,469 | 10/1993 | Tanaka et al. | 437/183 X |

FOREIGN PATENT DOCUMENTS

| | | | |
|---|---|---|---|
| 3305952 | 8/1984 | Fed. Rep. of Germany | 439/68 |
| 52-11862 | 1/1977 | Japan | 257/778 |
| 55-115344 | 9/1980 | Japan | 228/180.2 |
| 56-148840 | 11/1981 | Japan | 228/180.2 |
| 57-210638 | 12/1982 | Japan | 228/180.2 |
| 59-3958 | 1/1984 | Japan | 357/74 |
| 60-072663 | 4/1985 | Japan | 437/183 |
| 1-183841 | 7/1989 | Japan | 357/74 |
| 2-14536 | 1/1990 | Japan | 228/180.2 |
| 403184353 | 8/1991 | Japan | 29/827 |
| WO89/02653 | 3/1989 | World Int. Prop. O. | 357/75 |

OTHER PUBLICATIONS

IBM Tech Discl Bull, vol. 18, No. 10, Mar. 1976, p. 3477, by L. Kuhn et al.
IBM Tech Discl Bull, vol. 25, No. 4, Sep. 1982, pp. 1952–1953, by J. C. Edwards.
IBM Tech Discl Bull, vol. 28, No. 4, Sep. 1985, p. 1422.
IBM Disclosure Bulletin, "Simultaneous Chip Placement-Multi-Chip Modules" by R. D. Audi, vol. 24, No. 9, Feb. 1982.
IBM Technical Disclosure Bulletin, "Separating Semiconductor Devices from Supporting Substrates", W. B. Roush et al., vol. 16, No. 1, Jun. 1973.

*Primary Examiner*—Carl J. Arbes
*Attorney, Agent, or Firm*—Charles J. Fassbender; Mark T. Starr

[57] ABSTRACT

An integrated circuit module having microscopic self-alignment features comprises: 1) an integrated circuit chip having a plurality of input/output pads in a pattern on a surface thereof; 2) an interconnect member having a surface which includes input/output pads in a pattern that matches the pattern of pads on the integrated circuit chip; and, 3) one of the surfaces has a predetermined number of holes of one-half to fifty mils deep and the other surface has a predetermined number of protrusions of one-half to fifty mils high which are shaped to fit into the holes and prevent the surfaces from sliding on each other when the input/output pads on both of the surfaces are aligned.

9 Claims, 6 Drawing Sheets

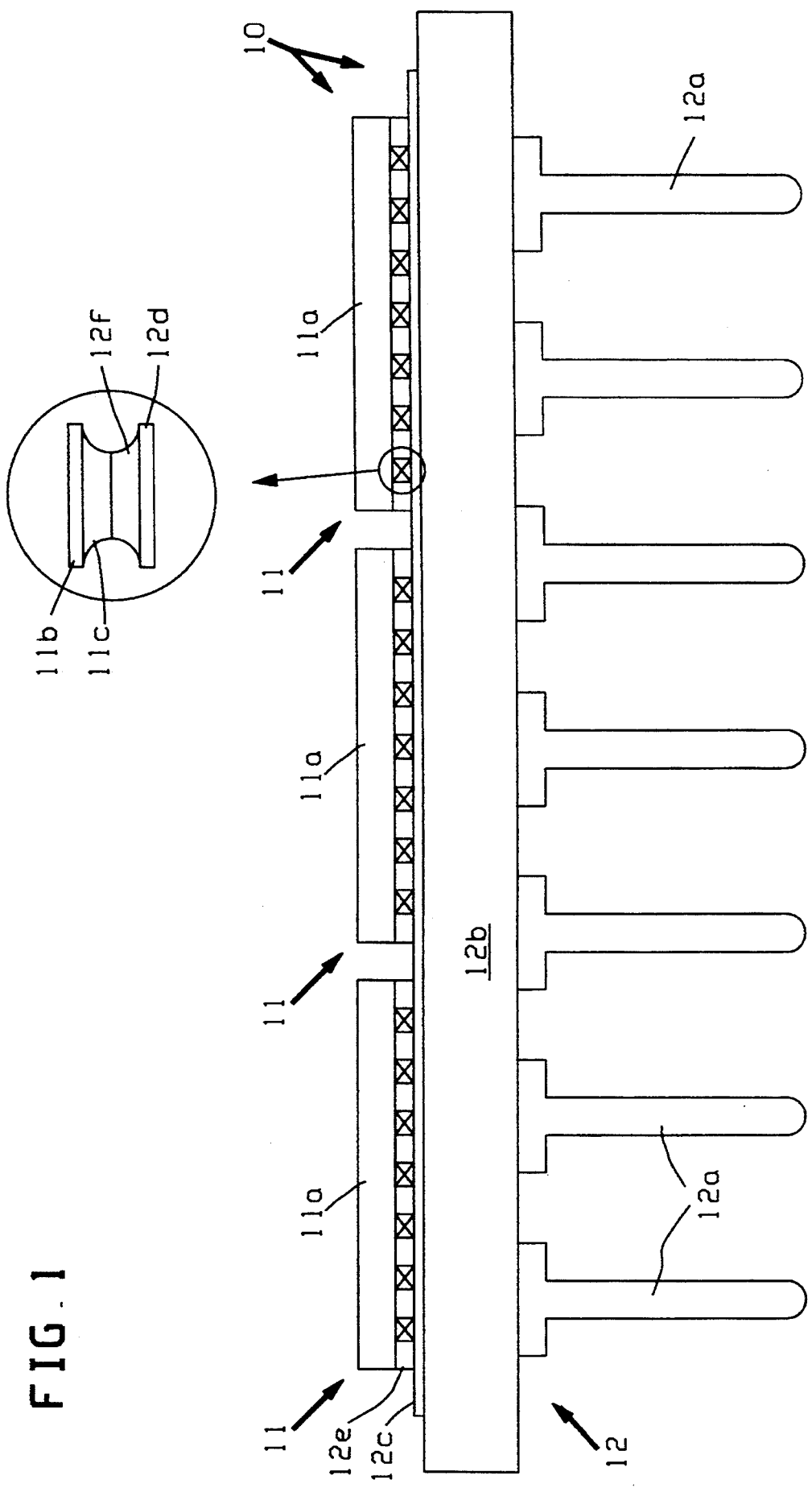

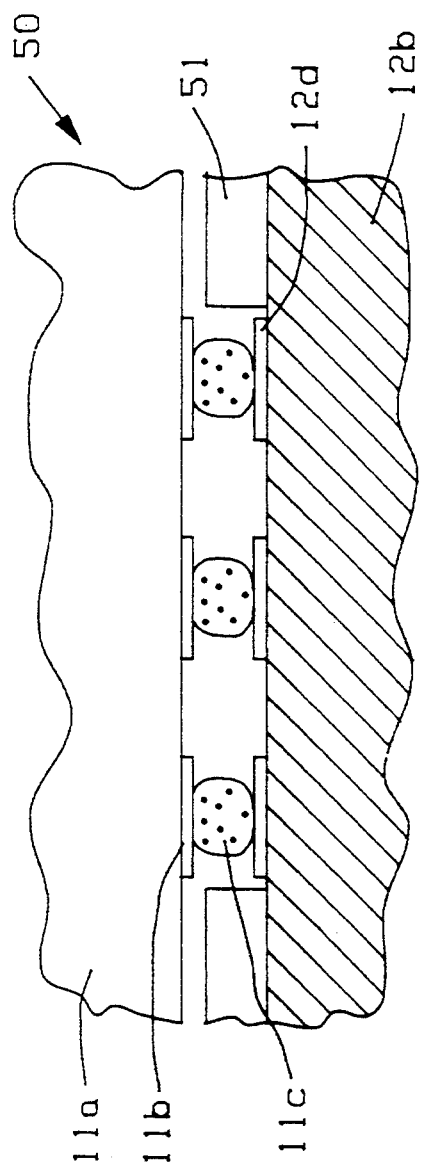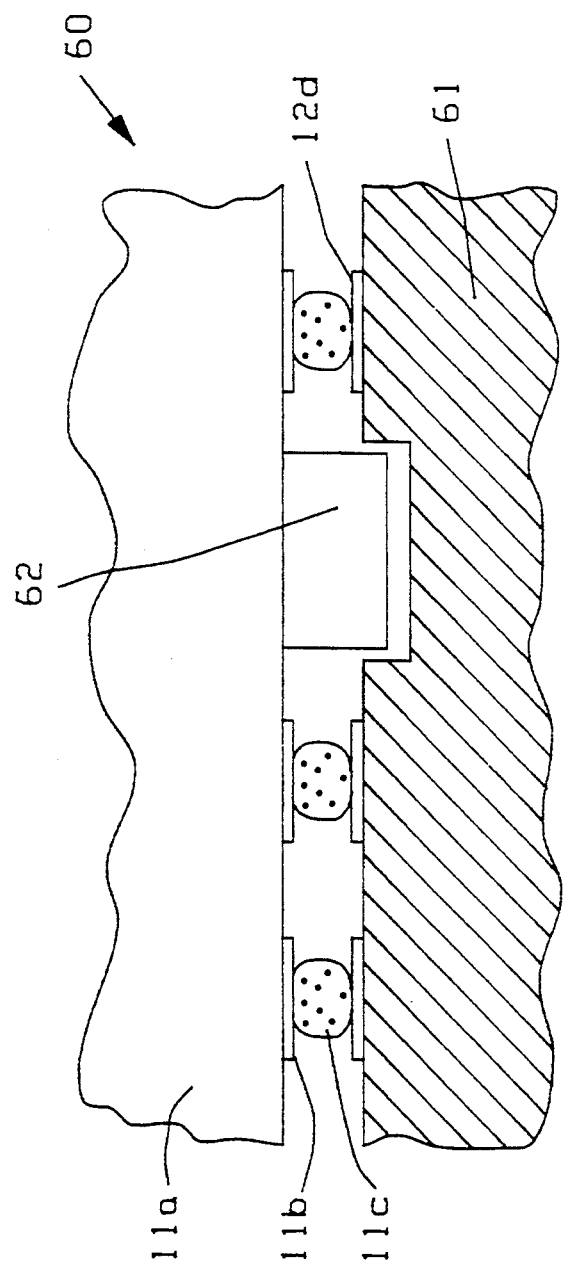

METHOD OF FABRICATING INTEGRATED CIRCUIT MODULE

This is a continuation of co-pending application Ser. No. 07/856,592 filed on Mar. 24, 1992 now abandoned.

BACKGROUND OF THE INVENTION

This invention relates to integrated circuit modules of the type in which one or more integrated circuit chips are mounted on an interconnect member such that multiple input/output pads on each chip are connected to corresponding input/output pads on the interconnect member.

In the above type of integrated circuit module of the prior art, the interconnect member has included a substrate which holds a single chip or which holds multiple chips. This substrate can be made of ceramic or silicon or epoxy glass. Thousands of patterned conductive signal lines are provided within and/or on top of the substrate; and, those signal lines include input/output pads which are arranged in a pattern that matches the input/output pads on each chip. One example of such a prior art interconnect member is described in U.S. Pat. No. 4,721,831 entitled "Module for Packaging and Electrically Interconnecting Integrated Circuit Chips on a Porous Substrate, and Method of Fabricating Same" by H. Vora issued Jan. 26, 1988. There, in FIG. 1, reference numeral 10 identifies the interconnect module and reference numeral 12 identifies the chips; and in FIG. 2, reference numeral 21 identifies the input/output pads on the interconnect module.

Now, a technical problem which somehow needs to be solved when fabricating integrated circuit modules of the above type is how to align the input/output pads on each chip with the corresponding input/output pads on the interconnect module while the chips are being attached to the interconnect module. This is a difficult problem because the input/output pads typically have small dimensions (e.g.—ten mils), are large in total number (e.g.—one hundred), and are blocked from view by the chip when the chip is placed on top of the interconnect member. However, if the input/output pads on a chip get misaligned with the corresponding input/output pads on the module, all electrical signals (including data signals, control signals, power and ground signals) will be misrouted to and from the chip; and, the resulting structure will be completely inoperable.

In the prior art, this problem of how to align the input/output pads on a chip to the input/output pads on an interconnect module was overcome by using specialized alignment machines. But, those machines are very complex and thus are very expensive. One such machine, for example, called a "M-9" from the Research Devices Division of the American Optical Corporation, provides an infrared light beam to "see" through the chip and thereby view when the input/output pads on the chip and the interconnect module are in line. But, this machine costs over $100,000. Another machine, called a MRSI-503M from Micro Robotics Systems, Inc. provides an optical probe with dual optical paths which fits between the chip and the substrate as they are positioned over each other so that their input/output pads can be viewed and lined up. But, this machine also costs over $100,000. Further, the above costs are for manually operated versions of both machines; automated versions cost over $200,000.

Accordingly, a primary object of the present invention is to provide an improved integrated circuit module that includes novel microscopic physical features on the chips and on the interconnect module which enable their input/output pads to be self-aligned without any alignment equipment.

BRIEF SUMMARY OF THE INVENTION

In accordance with the present invention, an integrated circuit module having microscopic self-alignment features comprises: a) an integrated circuit chip having a plurality of input/output pads in a pattern on a surface thereof, b) an interconnect member having a surface which includes input/output pads in a pattern that matches the pattern of pads on the integrated circuit chip, and c) one of the surfaces has a predetermined number of holes that are one-half to fifty mils deep, and the other surface has a predetermined number of protrusions that are one-half to fifty mils high and which are shaped to fit into the holes and prevent the surfaces from sliding on each other when the input/output pads on both of the surfaces are aligned. With this structure, the input/output pads on the chip are aligned automatically with the input/output pads on the interconnect member without any alignment equipment by the steps of placing the chip on the interconnect member such that the protrusions separate the two surfaces; and, sliding the chip by hand in random directions on the interconnect member until the protrusions drop into the holes and stop the sliding motion. This stopping of the sliding action indicates that alignment has occurred. Thereafter, the aligned input/output pads are joined together by reflowing a solder paste between them.

BRIEF DESCRIPTION OF THE DRAWINGS

Various preferred embodiments of the present invention are described in detail herein in conjunction with the accompanying drawings wherein:

FIG. 1 is an enlarged sideview of an integrated circuit module which is a first embodiment of the invention;

FIG. 1A is a magnified view of a portion of the integrated circuit module in FIG. 1;

FIG. 7 is an enlarged view of a portion of another integrated circuit module which is a fourth modification to the FIG. 1 module; and, FIG. 8 is an enlarged view of a portion of another integrated circuit module which is a fifth modification to the FIG. 1 module.

DETAILED DESCRIPTION

Figure 2A:
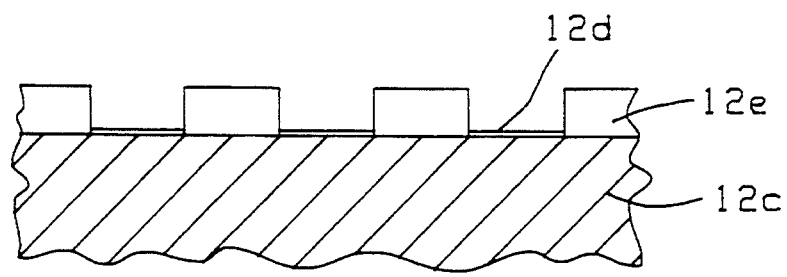
FIGS. 2A thru 2F are further enlarged views of a portion of the FIG. 1 module which show a preferred process by which the module is fabricated.

Referring now to FIG. 1, it shows a magnified view of an integrated circuit module 10 which is one preferred embodiment of the present invention. Included in this module 10 are a plurality of integrated circuit chips 11 and an interconnect member 12 for those chips. Reference numerals 11a, 11b, and 11c indicate the principal parts of each of the chips 11 which are relevant to the present invention. Likewise, reference numerals 12a, 12b, 12c, 12d, 12e, and 12f indicate the principal parts of the interconnect member 12 which are relevant to the present invention.

Part 11a is a silicon die on which thousands of transistors have been made by any conventional integrated circuit fabrication process. Part 11b is an input/output pad on a surface of the die 11. And, part 11c is a reflowed solder bump which prior to being reflowed was attached to one of the input/output pads 11b but not to the interconnect member 12.

Part 12a is an input/output pin. Part 12b is a co-fired multi-layer ceramic substrate having thousands of patterned conductive signal lines (not shown) which lie on and go through the ceramic layers. Part 12c is a stack of several layers of polyimide, having thousands of patterned conductive signal lines (not shown) on each polyimide layer, which is integrated onto the substrate 12b. Part 12d is an input/output pad on the polyimide stack 12c. Part 12e is a layer of photoresist which has holes over each of the input/output pads 12d. And, part 12f is a reflowed solder fillet which prior to being reflowed was attached to an input/output pad 12d and partially filled the hole in the photoresist layer 12e.

On each chip 11, the input/output pads 11b are arranged in some particular pattern; and, on the interconnect member 12, the input/output pads 12d are arranged in a matching pattern. These matching patterns of the input/output pads 11b and 12d must be aligned before the solder 11c and 12f is reflowed. Otherwise, if the input/output pads 11b and 12d are misaligned, the electrical signals which those pads carry between the chip 11 and the interconnect member 12 will be routed incorrectly.

Now, in accordance with the present invention, the input/output pads 11b are aligned automatically with the input/output pads 12d by simply positioning the solder bumps 11c into the holes of the photoresist layer 12e. This positioning of the solder bumps 11c into the holes of layer 12e is easily achieved without any expensive alignment equipment by the steps of: a) placing the chip 11 on the interconnect member 12 such that the solder bumps 11c rest on the photoresist layer 12e; and b) sliding the chip 11 by hand in random directions on the photoresist layer 12d until the solder bumps 11c drop into the photoresist layer holes and stop sliding. This stopping of the sliding action can be felt, and it indicates that alignment has occurred. Thereafter, the solder 11c and 12f is reflowed so that it joins the aligned input/output pads.

To fully appreciate the difficulty of the alignment problem which the above steps a) and b) overcome, recall that in FIG. 1 the module 10 is magnified so that all of the parts 11a–11c and 12a–12f can be seen. However, in the actual module 10, the dimensions of the parts 11b, 11c, 12c, 12d, 12e, and 12f are microscopic.

In particular, the solder bumps 11c are between one-half mil and fifty mils high; the patterned layer 12e is between one-half mil and fifty mils thick; and, the depth of the holes that are provided in layer 12e into which the solder bumps drop are less than the thickness of that layer. However, those holes must be at least one-half mil deep in order for the sidewalls of the holes to resist the sliding motion of the solder balls with a force of at least one pound so that it can be felt. Preferably, to provide extra slide resisting force and accommodate variations in flatness between the chip 11 and interconnect member 12, the holes in layer 12e into which the solder bumps drop are at least one mil deep. Also preferably, to increase the packing density of the solder bumps 11c, those bumps are one to twenty mils high and layer 12e is one to twenty mils thick.

In the FIG. 1 modules, the total number of input/output pads 11b on any one chip 11 can be several thousand. Each such pad is between one mil and fifty mils on a side, and the spacing between pads can be as small as the thickness of layer 12e. Consequently, without providing the holes in the patterned resist layer 12e for the solder bumps 11c to fall into, it is essentially impossible to align the input/output pads by hand.

Referring next to FIGS. 2A–2F, they show a complete process for fabricating the module 10. Initially in this process, the patterned photoresist layer 12e is formed by covering parts 12c and 12d of the interconnect member 12 with an unpatterned layer of photoresist, exposing the unpatterned photoresist layer to ultraviolet light through a mask which blocks the light over just the input/output pads 12d, and removing the unexposed photoresist. FIG. 2A shows the result of this step. Here, the mask which blocks the light over the input/output pads can be aligned with those pads within a tenth of a micron by a mask aligner, such as a model MA56W from Karl Suss Corporation for example.

Figure 2B:
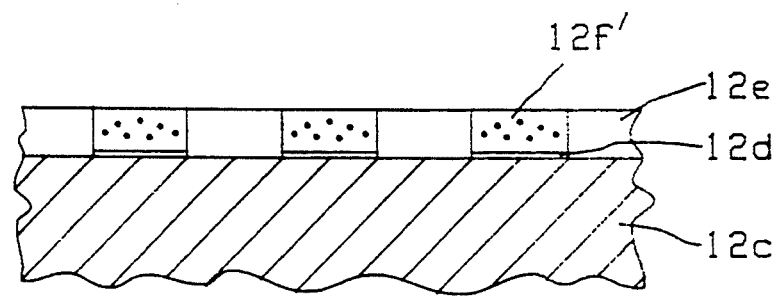

Thereafter, as is shown in FIG. 2B, the openings in the photoresist layer 12e are filled with a solder paste 12f'. This is achieved by pushing the solder paste 12f' into the openings with a "squeegee". One example of a suitable material is a fine pitch solder paste having a minus 400 mesh size from Heraeus, Inc.

Figure 2C:
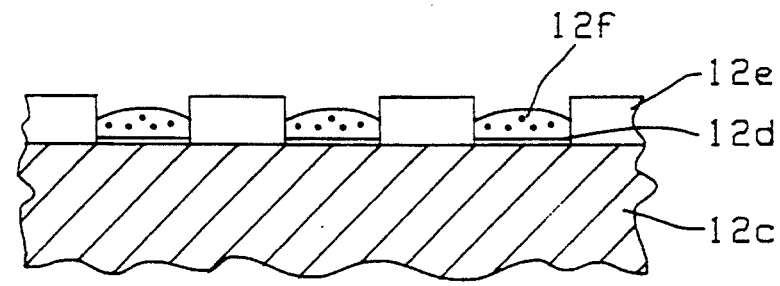

Subsequently, the structure of FIG. 2B is subjected to a high temperature for a predetermined time interval in order to vaporize and remove a portion of the solder paste 12f' leaving the fillets 12f. FIG. 2C shows the result of this step. This high temperature vaporizing step is carried out by passing the structure of FIG. 2B through an infrared heating belt furnace having a predetermined temperature profile which is set as a function of the particular solder that is used. As an example of the above step, one actual part was subjected to a peak temperature of 220° C. for 30 seconds.

Figure 2D:
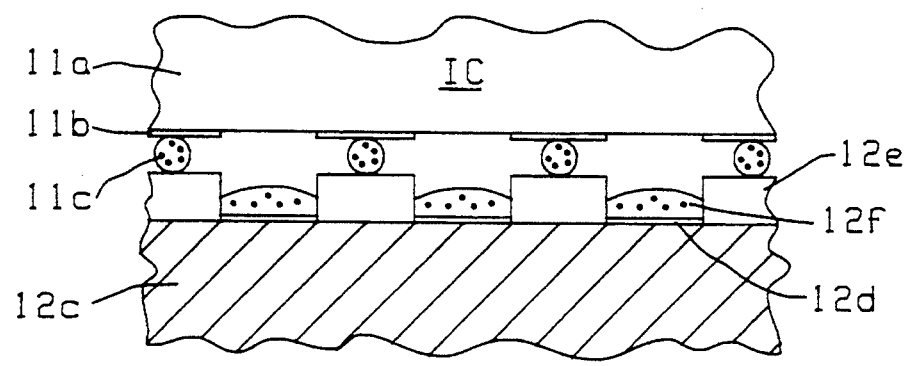
Figure 2E:
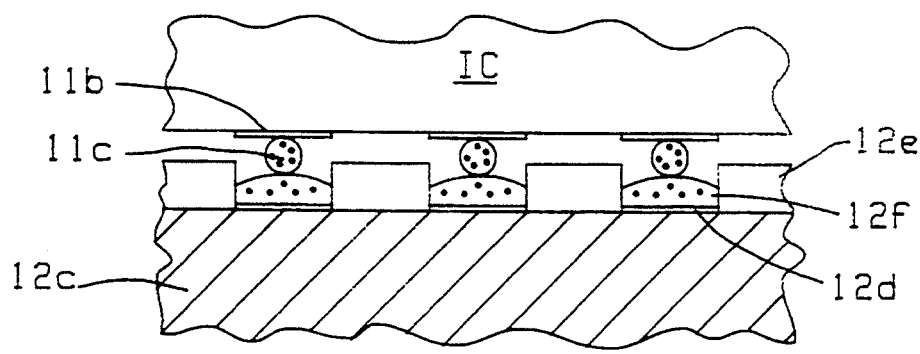

Following the above steps, an integrated circuit chip 11 having solder bumps 11c attached to its input/output pads 11b is placed on top of the FIG. 2C structure. FIG. 2D shows the result of this step. To fabricate the solder bumps 11c on the chip 11, a stencil is placed on the chips such that openings in the stencil expose just the input/output pads 11b; solder paste is pushed through the stencil openings onto the input/output pads 11b; the stencil is lifted off of the chip 11; and the solder is heated until it forms a ball due to surface tension. Here, the stencil for the solder paste is aligned to the input/output pads 11b within + or − one mil using a screen printer, such as model AP-20 from MPM corporation.

Thereafter, the input/output pads 11b on the chip 11 are aligned with the input/output pads 12d of the interconnect member 12 by sliding the chip 11 in random directions until the solder bumps 11c drop into the holes of photoresist layer 12e. This alignment step is performed by feel only; no precise visual alignment equipment is involved. When the chip 11 can no longer slide because its solder bumps 11c are caught in the holes of the photoresist layer 12e, alignment has been achieved.

Figure 2F:
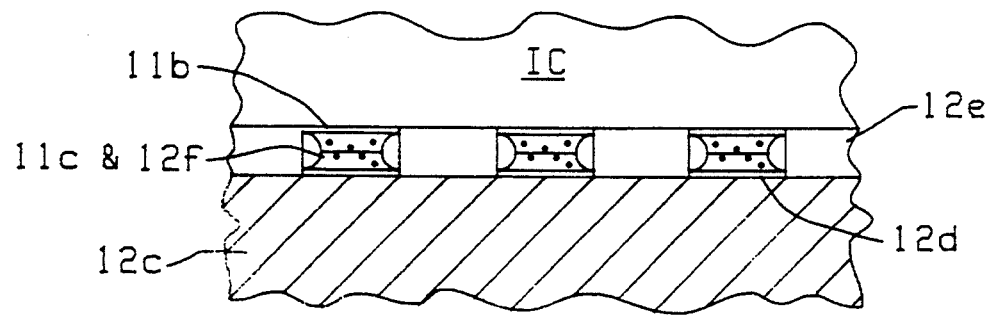

Following the above alignment step, the solder bumps 11c are reflowed in order to physically join the input/output pins 11b and 12d. FIG. 2F shows the results of this step. Here again the reflow is achieved by subjecting the FIG. 2E structure to a temperature which is high enough to soften the solder for a few seconds.

Figure 3A:
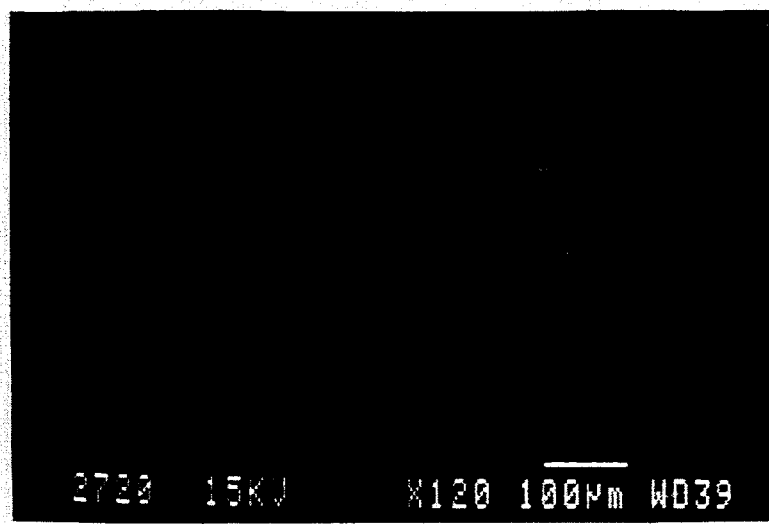
FIGS. 3A thru 3C are microphotos of certain parts of an actual module that was fabricated by the process of FIGS. 2A thru 2F.
Figure 3B:
Figure 3C:
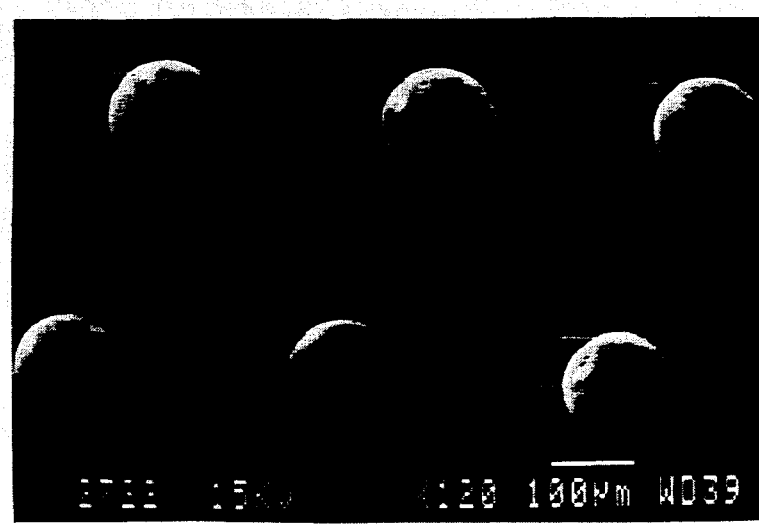

Turning now to FIGS. 3A–3C, some microphotos of an actual module 10 at various stages of its fabrication will be described. Beginning with FIG. 3A, it shows the interconnect member 12 on which the photoresist layer 12e has been formed with openings over just the input-/output pads 12d. This microphoto corresponds to the previously described FIG. 2A.

Next, FIG. 3B shows the interconnect member 12 after the holes in the photoresist layer 12e have been partially filled with solder paste 12f. This microphoto corresponds to the previously described FIG. 2C.

In the FIGS. 3A and 3B, the photoresist layer 12e is only four mils thick; the holes in layer 12e are only seven mils in diameter; the edge-to-edge spacing between the holes of each row also is only seven mils; and the depth of the holes after they have been partially filled with the solder paste 12f is two mils. These microscopic dimensions, which result in a hole-to-hole pitch of fourteen mils, are evidenced by the scale that is imprinted on the photos.

Lastly, FIG. 3C shows the chip 11 after the solder bumps 11c have been formed on the input/output pads 11b. In this microphoto, the chip 11 is as shown in the previously described FIGS. 2A and 2D. Also in this microphoto, the solder bumps 11c are only three to four mils high.

One preferred embodiment of the invention, as well as a preferred process for fabricating that embodiment, have now been described in detail. In addition, however, various modifications can be made to that embodiment without departing from the nature and spirit of the invention. Some of these modifications are illustrated in FIGS. 4–8.

Figure 4:
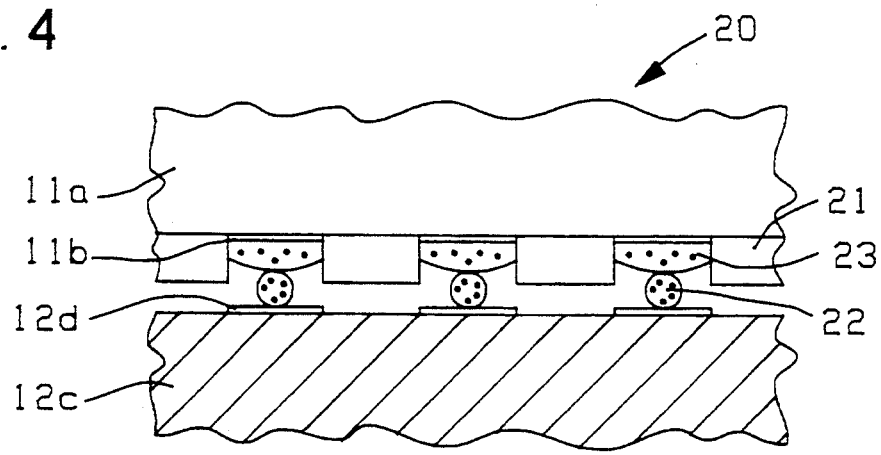
FIG. 4 is an enlarged view of a portion of another integrated circuit module which is a first modification to the FIG. 1 module.

Considering now FIG. 4, it shows the details of a first modification 20 to the integrated circuit module 10. This modified module 20 includes a patterned photoresist layer 21 on the chip 11 (rather than the layer 12e on the interconnect member 12); and it includes solder bumps 22 on the interconnect member 12 (rather than the bumps 11c on the chip 11). Layer 21 has respective openings over the input/output pads 11b of the chip 11, and those openings are partially filled with solder fillets 23. All other parts of the module 20 are the same as the previously described module 10, and like parts are identified by like reference numerals.

Figure 5:
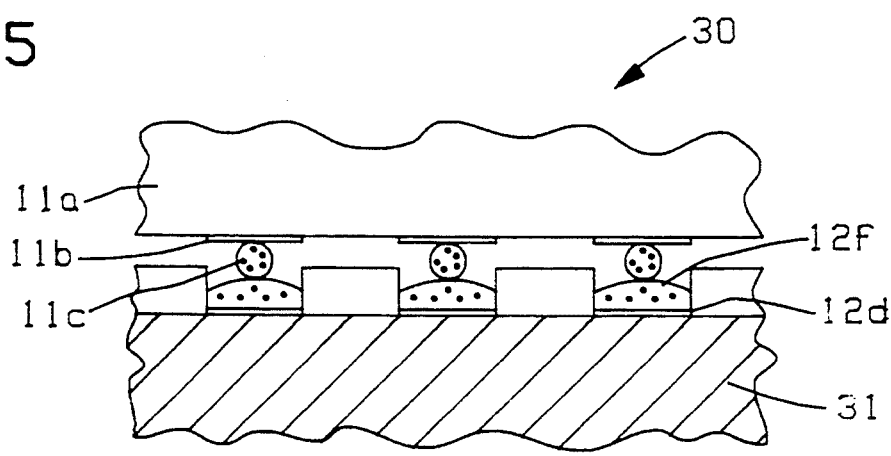
FIG. 5 is an enlarged view of a portion of another integrated circuit module which is a second modification to the FIG. 1 module.

Next, turning to FIG. 5, it shows the details of another modified embodiment 30 of an integrated circuit module. In module 30, a stack 31 of polyimide layers is included on the interconnect member 12; and, the top layer of the stack 31 has through holes over the input-/output pads 12d. This top layer of the stack 31 replaces the photoresist layer 12c of the previously described module 10. All other parts of module 30 are the same as in module 10, and they are identified with like reference numerals.

Figure 6:
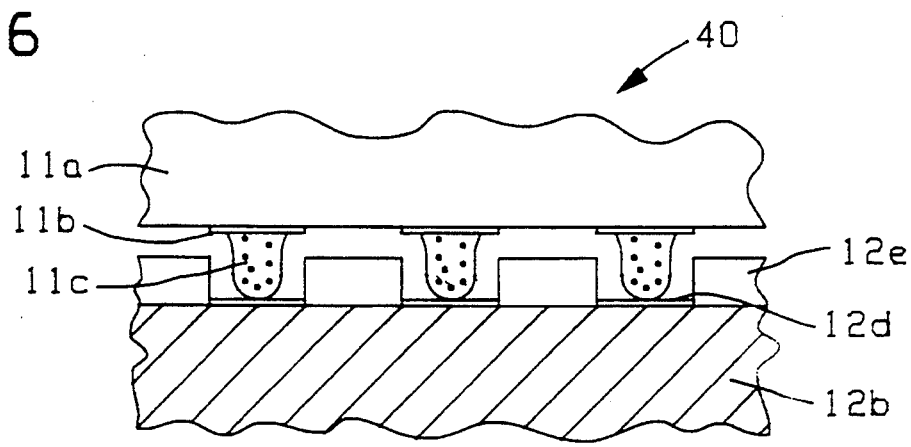
FIG. 6 is an enlarged view of a portion of another integrated circuit module which is a third modification to the FIG. 1 module.

Next, considering FIG. 6, it shows the details of still another modified embodiment 40. This module 40 is identical to the previously described module 10 except that the solder fillets 12f in the photoresist layer 12c are eliminated. Here, the solder bumps 11c are made larger than the thickness of the photoresist layer 12e so that the solder bumps 11c rest directly on the input/output pads 12d of the interconnect member 12 after alignment has occurred. Here again, like parts between the modules 10 and 40 have the same reference numerals.

Next, referring to FIG. 7, it shows the details of yet another modified embodiment 50. In module 50, a photoresist layer 51 is provided on the interconnect member 12; one or more openings are patterned in the layer 51; and, each opening has a perimeter that matches the perimeter of a group of several solder bumps 11c on the chip 11. When an entire group of solder bumps 11c drops into an opening in the photoresist layer 51, all of the solder bumps 11c in that group are aligned with their corresponding input/output pads 12d on the interconnect member 12. With this embodiment 50, multiple openings in layer 51 may be provided for each chip 11, or only a single opening may be provided for each chip.

Next, turning to FIG. 8, it shows the details of still another modified embodiment 60. In this module 60, a stack 61 of polyimide layers is provided on the interconnect member 12; several spaced apart openings go through the top layer of the stack 61; and, a layer of photoresist 62 is provided on the chip 11 which is shaped to fit into the openings of the stack 61. When the resist layer 62 is in the opening of stack 61, the input-/output pads 11b on the chip 11 are aligned with the input/output pads 12d on the interconnect member 12. These openings in the top layer of the stack 61 can have various patterns such as elongated slots by two edges of the chip 11, or one rectangle by each corner of the chip. As an alternative in the module 60, the top layer in the polyimide stack 61 can have just one respective opening for each chip 11. For example, the opening can be a slot which lies along the entire perimeter of the chip 11. As before, the photoresist layer 62 is patterned to fit into the opening in the top layer of the stack 61.

As still another variation to all of the embodiments of FIG. 1 thru FIG. 8, the patterned photoresist layers can be made of a different insulating material. For example, those layers (part 12e of FIG. 1, part 21 in FIG. 4, part 12e of FIG. 6, part 51 in FIG. 7, and part 62 in FIG. 8) can be made of a polyimide or silicon dioxide or silicon nitride. Likewise, the top layer of polyimide in FIGS. 5 and 8 (the top layer of stack 31 and 61) can be made of other materials such as photoresist or silicon dioxide or silicon nitride.

Similarly, the embodiments of all of the FIGS. 1 through 8 can be modified by replacing the polyimide stack 12c with additional ceramic layers on the ceramic substrate 12b. With this modification, the input/output pads 12d of the interconnect member would lie on the top ceramic layer. Also, one extra layer of ceramic could be added to the top of the substrate in which alignment holes are patterned which correspond to the holes in layer 12e of FIGS. 1, 2A–2F, and 3A–3C. Likewise, this extra ceramic layer could have holes which correspond to the holes in the top layer of stack 31 in FIG. 5; or the holes in layer 51 in FIG. 7, or the holes in the top layer of stack 61 in FIG. 8.

As still one other variation to all of the embodiments that are described above, the chip 11 can be replaced by a stack of chips which are glued together and have input/output leads on one surface of the stack. Such a chip stack is described, for example, in U.S. Pat. No. 4,959,749 which issued Sep. 25, 1990. Therefore, in this description and the claims which follow, the word "chip" shall mean a single chip or a chip stack.

A structural feature which is generic to all of the embodiments of FIG. 1 thru FIG. 8 and their above described modifications is that the chip 11 and interconnect member 12 have respective surfaces with input/output pads that must be aligned; and, to accomplish that alignment, one of the surfaces has at least one hole of one-half mil to fifty mils deep and the other surface has a certain number of protrusions of one-half mil to fifty mils high which fit into and catch on the hole sidewalls when the input/output pads on both surfaces are aligned. These protrusions can be extensions of the input/output pads (as in the embodiments of FIGS. 1 thru 7), or they can be separate from the input/output pads (as in the embodiment of FIG. 8). Further, multiple holes can be provided for the protrusions to fit into (as in the embodiments of FIGS. 1 thru 5), or a single hole can be provided (as in the embodiments of FIGS. 7 and 8).

Accordingly, since the present invention can be embodied in many different structures, it is to be understood that the present invention is not limited to any particular one of the detailed structures shown in FIG. 1 thru FIG. 8 but is defined by the appended claims.

What is claimed is:

1. A method of fabricating an integrated circuit module which comprises - a) an integrated circuit chip having a plurality of input/output pads in a pattern on a surface thereof, and b) an interconnect member having a surface with input/output pads in a pattern that matches said pattern of pads on said integrated circuit chip; said method including the steps of:

forming an electrical insulating layer on one of said surfaces with a predetermined number of holes with vertical sidewalls which encompass said pads on said one surface, and forming a single solder ball on each of said pads on the other surface;

randomly placing said solder balls in contact with said insulating layer such that said matching patterns of input/output pads are randomly misaligned with each other; and, sliding said surface with said solder balls parallel to said insulating layer, in random directions, until said solder balls drop into said holes of said insulating layer.

2. A method according to claim 1 wherein said one surface has multiple holes and said other surface has a single respective solder ball for each hole.

3. A method according to claim 1 wherein said one surface has multiple holes and said other surface has a respective group of several solder balls for each hole.

4. A method according to claim 1 wherein said one surface has just a single hole and said other surface has multiple solder balls all of which fit into said single hole.

5. A method according to claim 1 wherein said insulating layer with said holes is on said interconnect member, and said solder balls are on said integrated circuit chip.

6. A method according to claim 1 wherein said insulating layer with said holes is on said integrated circuit chip, and said solder balls are on said interconnect member.

7. A method according to claim 1 wherein said holes in said insulating layer are partially filled with solder.

8. A method according to claim 1 wherein said holes are one-half to fifty mils deep and said solder balls are one-half to fifty mils high.

9. A method according to claim 1 wherein said holes are defined by a patterned layer of material selected from photoresist, polyimide, silicon dioxide, silicon nitride, and ceramic.

* * * * *